United States Patent [19]

Schwartz et al.

[11] Patent Number: 4,658,286
[45] Date of Patent: Apr. 14, 1987

[54] METHOD AND APPARATUS FOR CORRECTING DISTORTIONS IN REPRODUCING SYSTEMS

[76] Inventors: Jack Schwartz; Tai T. Wu, both of 147 Ridge St., Arlington, Mass. 02174

[21] Appl. No.: 479,275
[22] Filed: Mar. 28, 1983
[51] Int. Cl.$^4$ .............................................. H04N 5/14
[52] U.S. Cl. ..................................... 358/37; 358/166; 358/21 R
[58] Field of Search ....................... 358/10, 27, 28, 29, 358/80, 30, 76, 21 R, 36, 37, 166, 167, 177, 284, 340; 356/404, 405; 364/553, 574, 724; 382/54; 375/14

[56] References Cited

U.S. PATENT DOCUMENTS

| | | | |
|---|---|---|---|
| 4,037,249 | 7/1977 | Pugsley | 358/76 |
| 4,136,360 | 1/1979 | Hoffrichter et al. | 358/80 |
| 4,141,072 | 2/1979 | Perreault | 364/553 |
| 4,212,072 | 7/1980 | Huelsman et al. | 358/167 X |
| 4,285,580 | 8/1981 | Murr | 358/80 X |
| 4,307,962 | 12/1981 | Jung | 358/80 X |
| 4,309,770 | 1/1982 | Godard | 375/14 |
| 4,500,919 | 2/1985 | Schreiber | 358/78 |

*Primary Examiner*—Michael A. Masinick
*Attorney, Agent, or Firm*—Robert F. Van Epps

[57] ABSTRACT

A method and apparatus for defining a plurality of subcategories of the information content of the input to a reproduction system and generating a set of signals corresponding to each such subcategory for the system output and an idealized output. The sets of signals are analyzed to derive a third set of signals which are used to improve a selected aspect or characteristic of rendition fidelity of the reproduction system output. While the invention is described in the context of video systems the principles disclosed are equally applicable to photography, optical scanners and audio systems as well as other multi-channel reproducing systems.

16 Claims, 18 Drawing Figures

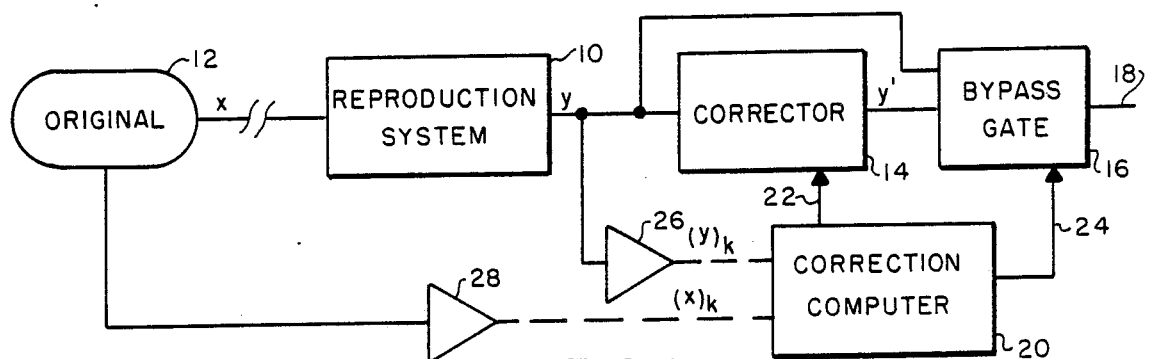
FIG. 1
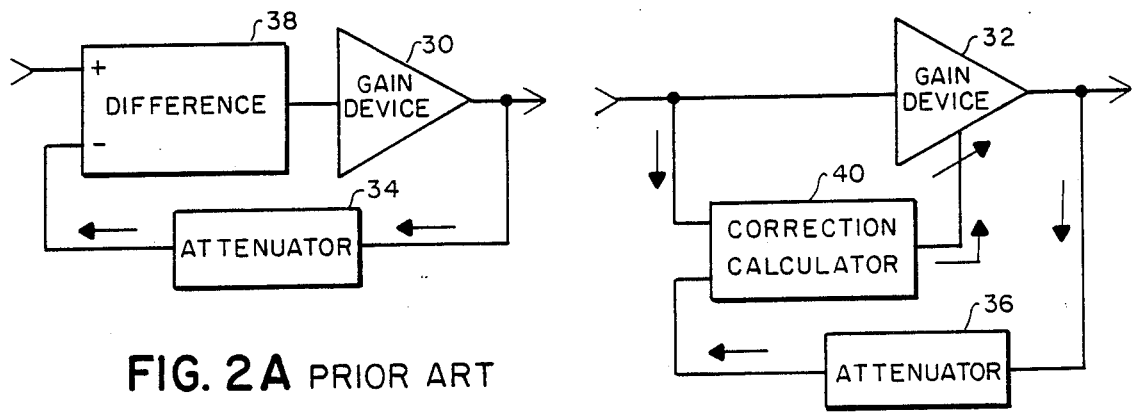
FIG. 2A PRIOR ART
FIG. 2B
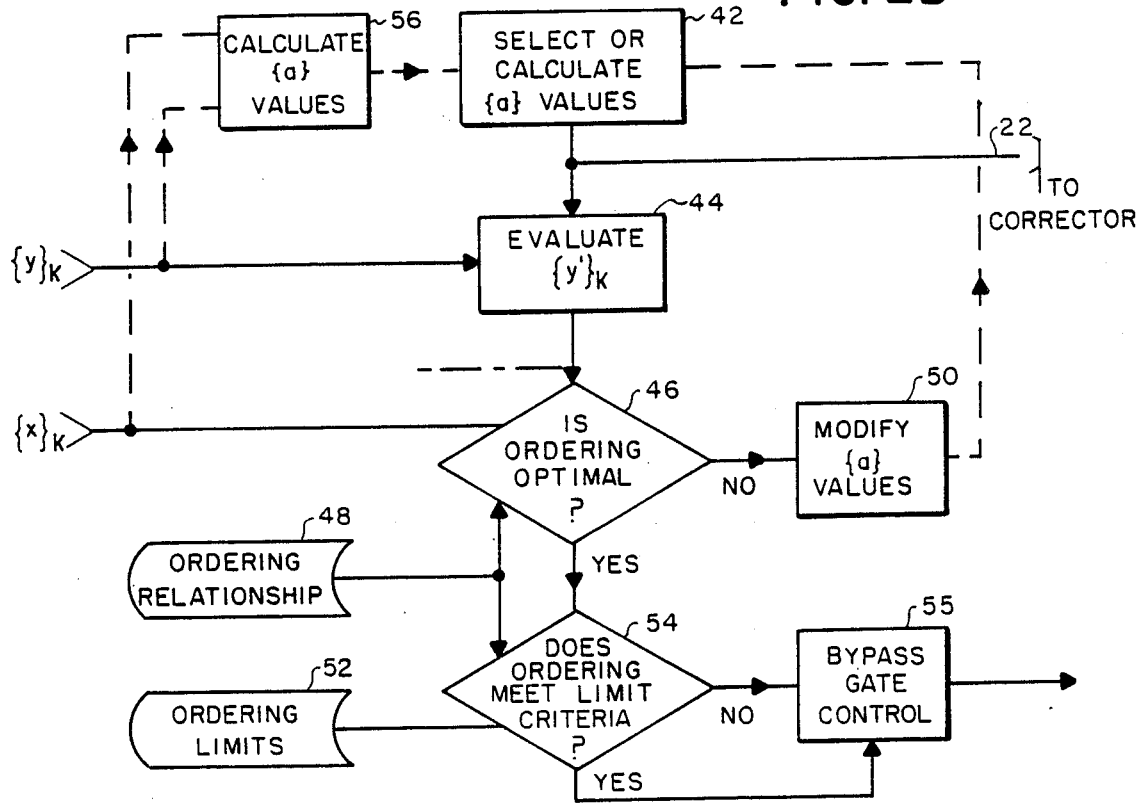
FIG. 3

METHOD AND APPARATUS FOR CORRECTING DISTORTIONS IN REPRODUCING SYSTEMS

BACKGROUND OF THE INVENTION

1. Field of the Invention

The present invention relates generally to an improved method and apparatus for correcting distortions in the information content of multi-channel reproducing systems including, without limitation, video systems (either optical or electronic) and audio systems.

2. Description of the Prior Art

The prior art most relevant to the present invention has arisen in the area of methods and devices for evaluating color photographic negatives and determining color compensation filter combinations to optimize the reproduction fidelity of the print. Representative of this prior art is U.S. Pat. No. 3,761,183 which issued to Yuasa, et.al. on Sept. 25, 1973, entitled Device for Measuring Color-Compensation Quantity for Color Printing. That patent is directed to a system for determining the optimal color compensating filters to be used in a photo enlarger when printing a given negative. The system uses photodetectors sensitive in the red, green and blue spectrum ranges to sense the average spectral content of a given negative. Signals from the respective photodetectors are compared to determine color compensating quantities in the green and blue and the red signal is used to determine exposure time. Operation of the system is premised on the assumption that the overall average color of the negative is neutral gray. Implicitly each color is weighted in the average by the area it occupies. In practical application, however, any given color negative will probably not exhibit an overall neutral gray. The system is therefore subject to error when non-average conditions are encountered. The error is analogous to that introduced by an exposure meter when the subject is backlighted.

U.S. Pat. No. 4,217,648 entitled Method and Apparatus for Evaluating Color Photographic Negatives Prior to Copying which issued to Thurm, et.al. on Aug. 12, 1980, is directed to a system which provides a measure of compensation for negatives exhibiting areas of dominant color. The color density in each of the primary colors in each of a plurality of unit areas of a negative is measured and compared in a computer with the respective densities in adjacent unit areas. The difference between the results of the measurements of two adjacent unit areas is stored only when it is below a predetermined value. The stored results indicate the presence or absence of areas of dominant color and are used to adjust the copying light accordingly. This system represents an improvement over simple averaging in that the more selective sampling permits adjustments of the copying light such that the selected average, now not weighted by area, is corrected to neutral gray. While probably applicable to a broader variety of picture material, the premise that the unweighted average by color area is gray fails to apply universally. For example, in a full face portrait, the flesh, hair and eye colors rarely average to gray. Adjustments of subtractive filters, in the primary colors is in effect an optical adjustment of the gain of each primary color channel. In actual practice, the adjustment of color filters affects not only the gain of each channel but also inter-channel cross-talk over which the Thurm, et.al. system has no explicit control.

The Applicants have found that filters that appear the same color to the human eye can affect the inter-channel cross-talk differently depending upon the details of their spectra in relation to the details of the print material spectra. The Wratten color compensating filters available from Eastman Kodak Co. and used in color photo enlargers are based upon standardized dyes. The dichroic color filters use evaporated films on glass and interference effects to provide the three primary color pass band type spectra with sharp cut offs. Each Wratten filter is calibrated with a number such as CC20Y which indicates a color compensating filter of an optical density of 0.20 in the yellow. If one selects a correction of CC20Y with a dichroic color head the corrective effect will be generally different from that achieved by use of the single Wratten filter. The difference stems significantly from the inter-channel cross-talk effect created by the combination of the separate dichroic color filters.

The prior art systems for correcting color rendition thus are seen to operate on three independent variables; i.e. the primary color channel gains (intra-channel gains). In order to provide any significant improvement in the art it is necessary to also control the inter-channel gains or cross-talks which, for a three channel system requires the coordinated adjustment of at least nine quantities, three of which are intra-channel gains and six are inter-channel gains. When applied to systems for correcting distortions in reproducing systems generally, the number of channels, N, can increase sharply, leading to at least $N^2$, gains, of which N are intra-channel gains and $N^2-N$ are inter-channel gains.

OBJECTS AND SUMMARY OF THE INVENTION

From the foregoing discussion it will be understood that among the various objectives of the present invention are the following:

the provision of a new and improved method and apparatus for correcting distortions in reproducing systems;

the provision of a method and apparatus of the above described character useful with respect to any reproducible phenomenon.

These and other objectives of the present invention are efficiently met by defining subcategories of the information content of a phenomenon to be reproduced. A first set of signals representing ideal characteristics of the phenomenon and a second set of signals representing the corresponding characteristics of the phenomenon as actually reproduced are generated. The first and second sets of signals are analyzed with respect to one another and used to generate a third set of corrective signals which are applied to the output of the reproducing system such that the phenomenon as reproduced and corrected represents the substantial equivalent of the original.

The foregoing as well as other objects, features and advantages of the present invention will become better understood from the following detailed description taken in conjunction with the various views of the appended drawings.

BRIEF DESCRIPTION OF THE DRAWINGS

FIG. 1 is a simplified block diagram of generic apparatus for correction of distortion in a reproducing system in accordance with the principles of the present invention:

FIG. 2A is a diagram of a prior art feedback system;

FIG. 2B is a diagram of a feedback system which incorporates the present invention;

FIG. 3 is a flow chart illustrating the operation of the correction computer of FIG. 1;

DESCRIPTION OF PREFERRED EMBODIMENT

Figure 4:
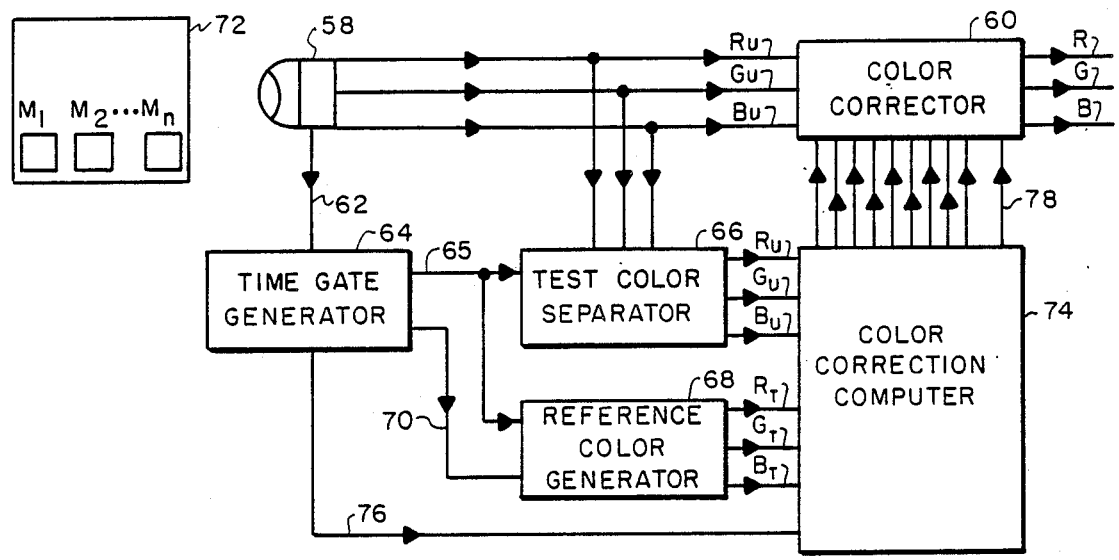
FIG. 4 is block diagram of an apparatus for correcting the color video output of a television camera.

With reference now to FIG. 1 there is shown in greatly simplified block diagram form a generic apparatus for the correction of distortion in a reproducing system. The reproducing system 10 could be a video system of the broadcast, closed circuit, tape or disc recorded types, a photography system such as a color printer or an optical scanner as used to generate halftone images or an audio system. Each of these systems generally tend to introduce some measure of distortion in the reproduction of the original.

The original phenomenon 12; a scene or a sound etc., may be represented by a signal or set of signals, x, which is presented to the input of the reproducing system 10. Thus, x is a vector of one or more components. The output, y, of the reproducing system is inevitably a function of x; i.e.:

$$y = R(x) \quad (1)$$

where y is also a vector of one or more components, the number of which may or may not be the same as that of x. The relationship of equation (1) may be linear or non-linear, and is in general of considerable complexity. A corrector 14 is coupled to the output of the reproducing system to produce a corrected signal, y', which depends upon y:

$$y' = g(y;\{a\}) \quad (2)$$

where {a} represents a set of one or more parameters which in effect modify the form of the relationship between y and y'. The purpose of the present invention is to provide a method and apparatus for choosing the function and parameters such that:

$$g(R(x);\{a\}) \quad (3)$$

is as close an approximation as possible to the set of input signals, x, or more generally, as close an approximation as possible to a set of signals that are equivalent to the set of input signals, x.

In effect, the present invention operates to determine the effective distortion function, R, of the reproducing system, approximate the effective inverse of that distortion function as closely as possible, and generate a set of corrective signals which may be used to modify the reproducing system output to most closely approximate the input. While it is understood that all of the various functions which make up the effective distortion function of the reproducing systems may not be determinable with complete mathematical precision, they may be approximated with sufficient accuracy to produce a corrected output which is improved relative to the uncorrected output.

When the general form of the function of equation (3) is well chosen, available choices of the {}parameter values will encompass a broad range of relationships of the type required to correct the distortions likely to be encountered in the particular reproducing system to be corrected. In effect, choosing the {a} values amounts to varying the form of the y',y relationship over some range of possibilities.

If a "good" correction has been determined such that the set of signals, y', at the output of the corrector 14 may be deemed a good approximation to the original set of signals, x, or their equivalent, a bypass gate 16 passes the corrected set of signals to the output 18. If preselected correction criteria are not adequately met, bypass gate 16 passes the uncorrected set of signals, y, to the output 18 to fulfill the premise that no correction is superior to a doubtful one. Alternatively, the bypass gate 16 output may be used to activate an indicator calling for operator intervention.

The correction, whether implemented or not, is determined in a correction computer 20, to be described in detail hereinbelow, and coupled to the corrector 14 via correction channel 22. A signal indicating that the correction does meet the preselected correction criteria is coupled via a correction bypass control channel 24 to the bypass gate 16. The dynamic or original-dependent inputs to the correction computer 20 have been denominated by the applicants as the "touchstone set" and defined as a sampled set of features representing the ideal original, $\{x\}_K$, and a corresponding sampled set of features of the uncorrected signal, $\{y\}_K$. It should be noted that the means 26 and 28 for sampling the uncorrected signal and the idealized original signal respectively produce sampled outputs which require substantially less signal transmission capacity than the mainstream of x, y and y' information.

FIGS. 2A and 2B are intended to distinguish, in a highly simplified fashion, between a conventional prior art feedback system, 2A, and a single-channel representation of a feedback system, 2B, which incorporates the present invention. In both systems gain devices 30 and 32 respectively introduce system distortion. Both have attenuators 34 and 36 that maintain suitable signal levels at 38 and 40 respectively. The conventional feedback system of FIG. 2A employs a difference unit 38 whereby an increment is added to the input signal of the gain device 30 which serves to modify the output. The feedback thus does not modify the properties of the gain device 30 in any way.

In the feedback system represented at FIG. 2B no increment is added to the input signal of the gain device 32. A correction calculator 40 samples the input and attenuated output of the gain device 32 and produces a signal approximating a proper set of parameters for the gain device 32 which signal is applied to the gain device to effectively modify the parameters of the device itself. Modification of gain in accordance with a current signal constitutes a nonlinearity affecting the stability of conventional feedback systems. With the relatively low data rate correction loop illustrated in FIG. 2B the stability of the circuit is enhanced.

FIG. 3 illustrates in flow chart form the operation of the correction computer 20 of FIG. 1. The operation is initiated at 42 with a set of either tentative or calculated values of the parameters, $\{a\}$, representing the form of the correction function of equation (3) required to approximate the relationship of equation (2) as closely as possible. The quality of the approximation is determined in the succeeding steps and the $\{a\}$ parameter values modified to improve it.

From a set of firm or trial values of $\{a\}$ the touchstone values $\{y\}_K$ may be substituted at 44 for y, one by one, yielding a set of corresponding simulated corrected values $\{y'\}_K$. This set of values is then compared at 46 with the idealized touchstone targets $\{x\}_K$ which, in the ideal case, would match.

In comparing the sets of values $\{y'\}_K$, $\{x\}_K$ the inequalities that generally are used to compare single numbers are broadened by use of an ordering relationship. This is defined as a criterion by which different comparisons of the sets of values may be ranked or ordered numerically as to quality. Relative values of a predetermined figure of merit constitute an ordering and the ordering relationship is stored at 48. If $\{y'\}_K$ and $\{x\}_K$ do not match and the ordering relationship is not optimal the $\{a\}$ values may be modified at 50 and the operation repeated.

A set of preselected ordering limits against which the quality of the approximation of $\{y'\}_K$ to $\{x\}_K$ may be judged as adequate or not for the corresponding correction to constitute an improvement is stored at 52. When the ordering limits are met at 54 the control bypass gate 55 is set to enable correction via correction channel 22. When the ordering limits are not satisfied the control bypass gate 16 is disabled preventing correction.

The $\{a\}$ values for a given implementation of the operation may be either directly calculated at 56 from the touchstone set values or determined iteratively through comparison at 46 and modification at 50. Since these alternative operations tend to be mutually exclusive, one or the other is used depending upon the particular implementation.

One illustrative embodiment of the applicants' invention is a method and apparatus for correcting the color output of a conventional television camera as shown in FIG. 4. The camera 58 has its red, green and blue video color channel outputs coupled to a color corrector 60. The outputs of the color corrector 60 are coupled to a transmitter in the case of a broadcast system or to a display in the case of a closed circuit system. The camera sync output 62 is coupled to a time gate generator 64 which when triggered provides a gate signal at output 65 to a test color separator 66 and a reference color generator 68. The time gate generator 64 also provides a digital word at output 70 which is coupled to the reference color generator 68 to identify a specific test color, $M_n$, whenever any test color appearing in the scene 72 is being scanned. The test colors $M_1, M_2 \ldots$ may for example be a standardized set such as the well known MacBeth Color Checker test chart produced by Munsell, a division of Kollmorgen Corporation of Newburgh, N.Y., and widely available in camera stores. The test colors may be arranged at predetermined locations within the scene 72 such that the corresponding time within each frame at which each test color is transmitted is known.

The red, green and blue video color channel outputs of camera 58 are also coupled to the test color separator 66 from which uncorrected test color components, converted to digital form, are applied to a color correction computer 74. The corresponding reference colors in digital form are produced by the reference color generator 68 and are coupled to the color correction computer 74 simultaneously with the uncorrected test color information.

When all the test colors in the scene 72 have been scanned, the time gate generator 64 provides an output pulse at output 76 which is coupled to the color correction computer 74 to initiate the correction process. In the simplest version where the color corrector is limited to a linear relation between the input and the output, the output of the color correction computer comprises a set of nine gain values representing the red, green and blue primary color channels as well as their respective interchannel couplings. In more sophisticated versions the color corrector takes into account non-linear effects and perhaps even delays, and the output of the color correction computer is modified accordingly. The color corrector 60 receives the output of the color correction computer and implements a correction to the video color signals from camera 58 throughout the entire video frame in accordance with the last frame for which corrections have been processed until an output signal at channel 78 indicates that a new correction has been determined and found satisfactory. If the computed gain corrections are not satisfactory the signal at channel 78 causes the color corrector 60 to pass the uncorrected color information from the camera 58.

The color correction computer 74 operates rapidly enough that its response is faster than the typical persistence of vision; i.e. approximately 0.1 second. Thus, the correction process is able to follow even sudden changes in scene illumination without a perceptible time lag. Even if the correction calculation is slower, a delay introduced at the camera input to color corrector 60 can assure that the corrections are properly applied.

Figure 5:
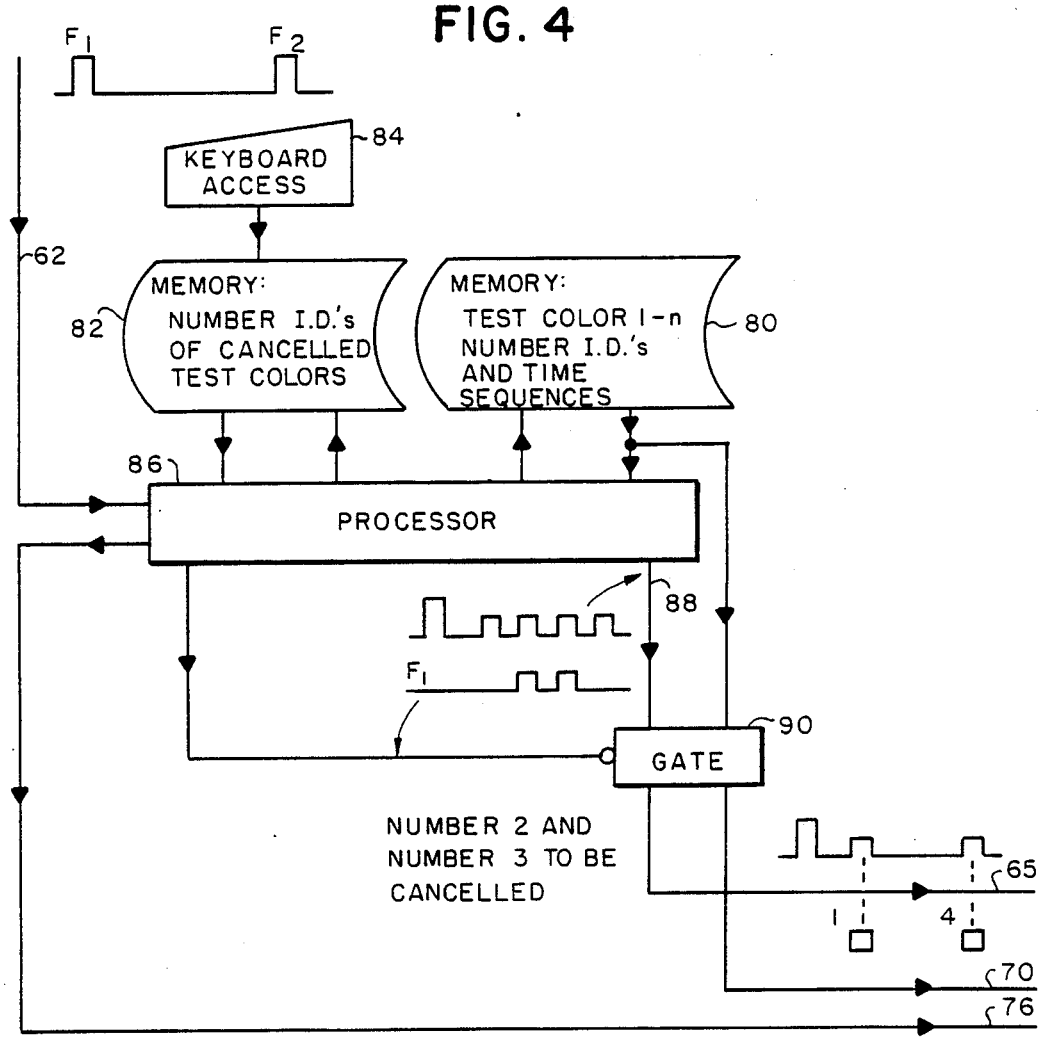
FIG. 5 is a block diagram of a time gate generator useful in the apparatus of FIG. 4.

FIG. 5 illustrates in block diagram form a time gate generator useful in the color correction system of FIG. 4 and wherein elements common to those of FIG. 4 are identified by like reference characters. The sync signal, $F_1, F_2, \ldots$, from the camera output 62 is based upon the relation between position and time, which is standardized in any given video system. The time gate generator output 65 thus corresponds to the time at which any test color is being scanned and output 76 identifies which test color is being scanned.

A first memory 80 stores information identifying each test color $M_1, M_2 \ldots$ and the time sequence within each frame that each color is transmitted. An additional second memory 82 stores the identity of which of the test colors, if any, are not currently to be used in the correction process; i.e. cancelled test colors. The memory 82 may be accessed via keyboard 84 to modify the selection of cancelled test colors when desired. Such access is rarely required once the most satisfactory test color choices for a given set of camera primaries have been determined since the choices are more strongly dependent upon video systems distortion than on variations in specific scene material.

A microprocessor 86, when triggered by the camera sync signal 62, interrogates memory 80 to determine when a test color is being scanned in accordance with its scene location and generates at output 88 a gating pulse, $F_1$, followed by a pulse corresponding to each test color. This signal is coupled through gate 90 to output 65. The processor 86 also interrogates memory 82 to identify any cancelled test colors and generate a corresponding pulsed signal which is used to inhibit gate 90 such that the output 65 represents the identity of only those test colors to be used in the correction process. The test color identities are also coupled from output 70 to the reference color generator of FIG. 4. When all test colors have been scanned the processor generates at output 76 a pulse to signal the color correction computer that all test colors have been transmitted.

Figure 6:
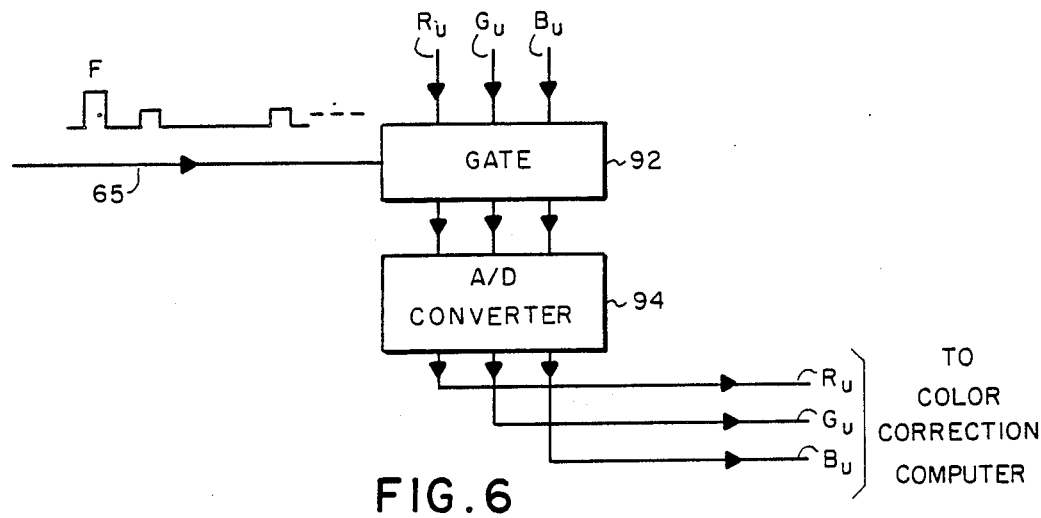
FIG. 6 is a block diagram of a test color separator useful in the apparatus of FIG. 4.

FIG. 6 illustrates the details of the test color separator 66 of FIG. 4. The circuit is driven by the red, green and blue video color channel output signals from the camera. These signals are applied to a gate 92 which is controlled by the output 65 of the time gate generator. Signals passed by gate 92 are coupled to an analog-to-digital converter 94. The converter output thus represents the uncorrected components of each test color in digital form and is coupled to the color correction computer.

Figure 7:
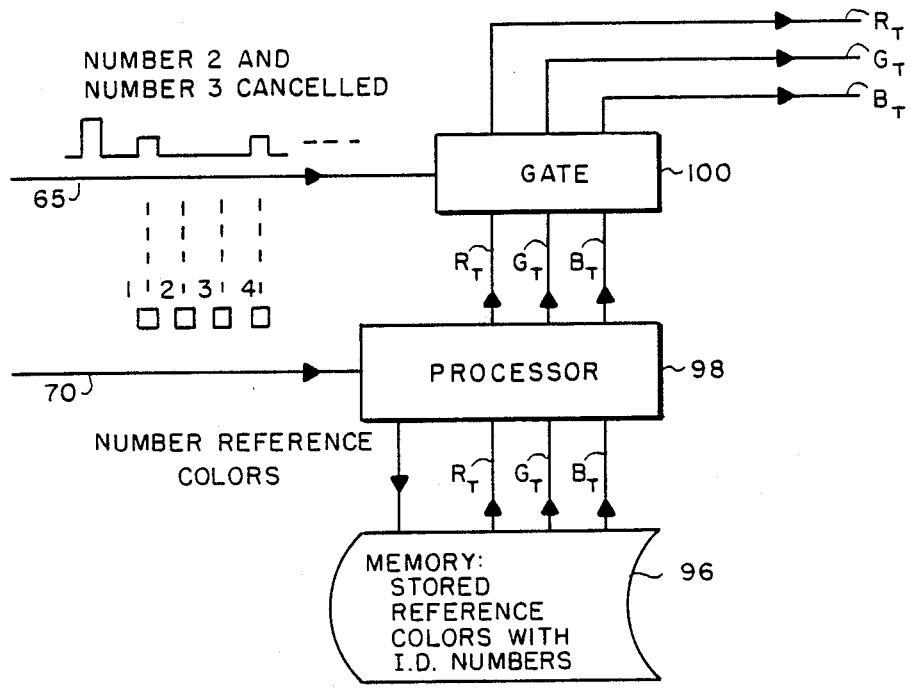
FIG. 7 is a block diagram of a reference color generator useful in the apparatus of FIG. 4.

The reference color generator is shown in FIG. 7. A memory 96 stores the identities of the three components of each reference color. When the processor 98 receives an identification number signal from the time gate generator output 70 it interrogates the memory 96 to determine the corresponding component values and couples them to a gate 100. If the gate signal from output 65 of the time gate generator indicates that the particular test color is not a cancelled color, the values are passed to the color correction computer simultaneously with the corresponding uncorrected component values.

Figure 8:
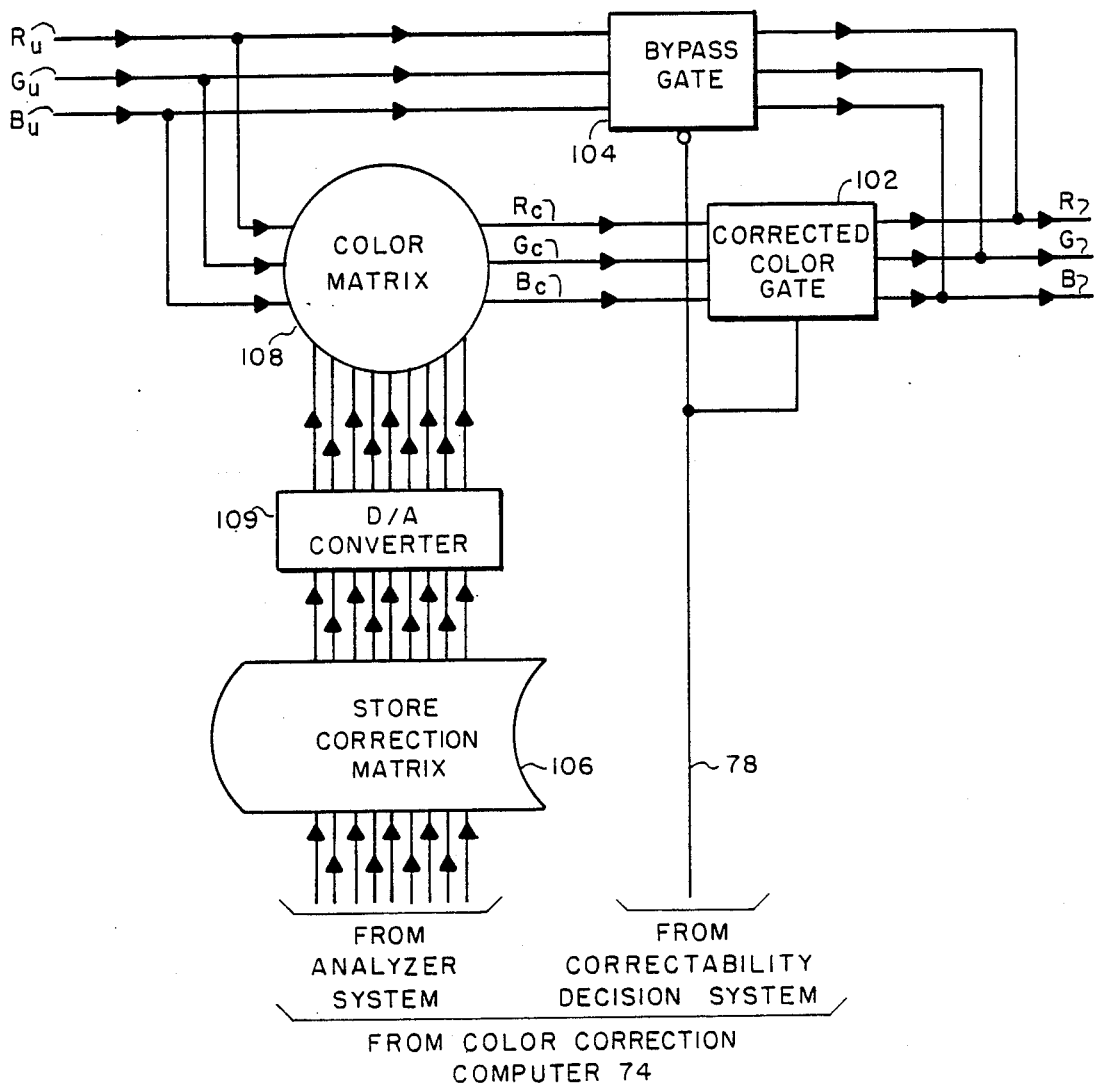
FIG. 8 is a block diagram of a color corrector useful in the apparatus of FIG. 4.

The color corrector 60 of FIG. 4 is represented in FIG. 8. Operation of the color corrector is controlled by a correctability signal from output 78 of the color correction computer. A logic level 0 at the computer output 78 signifies that no acceptable color correction is available. That signal is applied to inhibit corrected color gate 102 and enable bypass gate 104. Under this condition the uncorrected video color signals from the camera are passed to the transmitter or display (not shown) as the case may be. When the logic level is 1 an acceptable color correction is available and the signal inhibits bypass gate 104 and enables corrected color gate 102. As discussed above, in the simplest version the color correction is represented by a set of nine gain values which are used for correction of the camera output signals until such time as a new set of satisfactory values has been computed.

The gain values are stored in a memory 106 and are coupled to control a color matrix 108 after conversion from digital to analog form in D/A converter 109. These analog signals represent correction gain inputs to the color matrix 108 which operates to provide color corrected video signals which are coupled to the transmitter or display when gate 102 is enabled.

Figure 9:
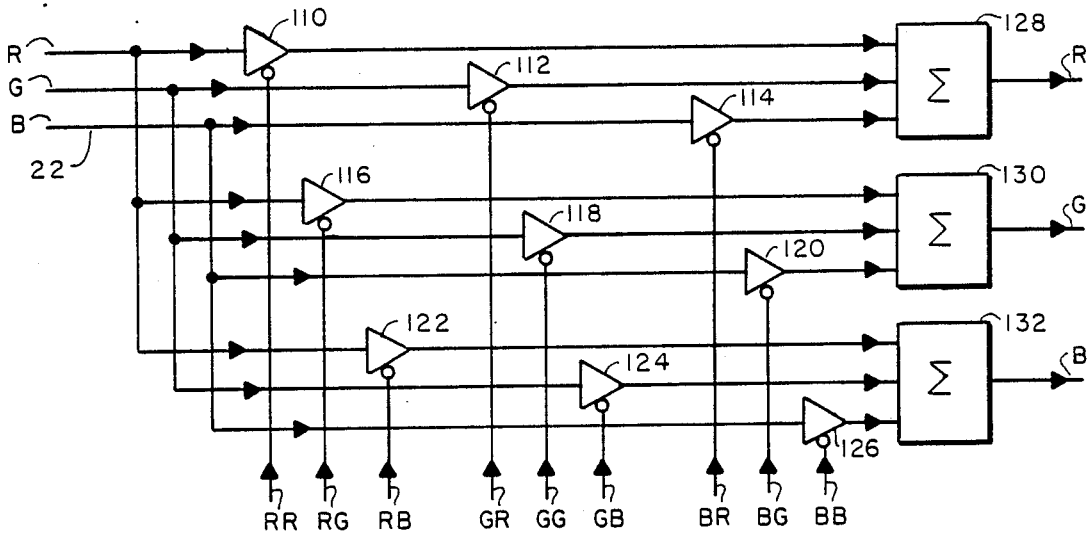
FIG. 9 is a block diagram of a color matrix useful in the apparatus of FIG. 8.

The details of the color matrix are shown in FIG. 9. The matrix is made up of a set of nine variable gain amplifiers 110-126. The uncorrected analog video color signals from the camera provide the inputs to the amplifiers. Specifically R is applied to amplifiers 110, 116 and 122, G is applied to amplifiers 112, 118 and 124 and B is applied to amplifiers 114, 120 and 126. The gain control input of each of the nine amplifiers is coupled to a respective correction gain output of the color correction computer. RR, GG and BB represent the intrachannel gain corrections while RG, GB, BR, etc. represent the interchannel gain corrections. The ouputs of amplifiers 110, 112 and 114 are coupled to a summation circuit 128, the output of which is the corrected red video color signal, R. Similarly the green, G, and blue, B, corrected signals are produced at the outputs of summation circuits 130 and 132 respectively.

Figure 10:
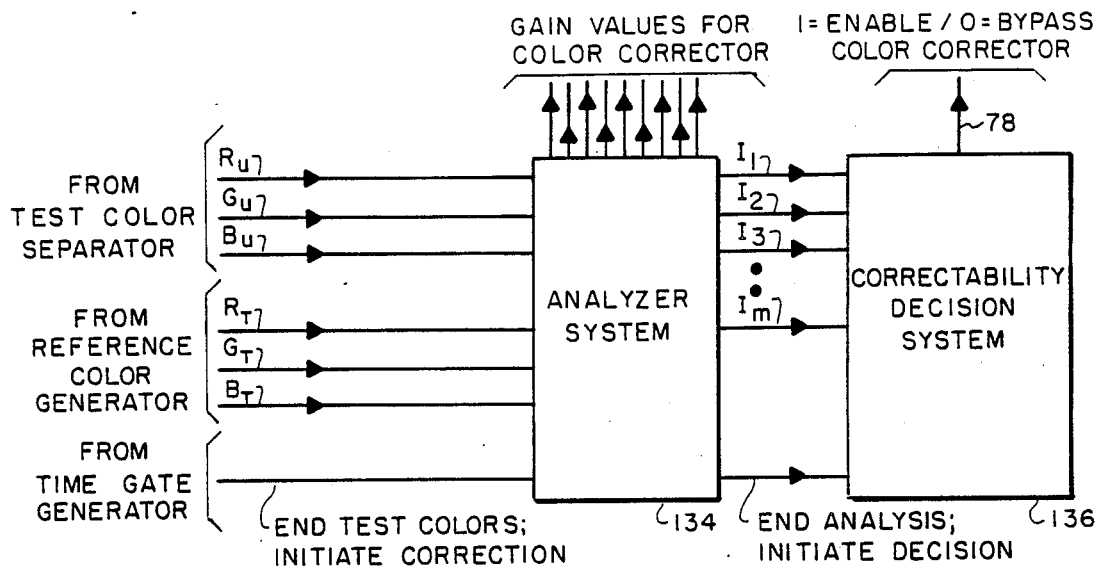
FIG. 10 is a simplified block diagram of the color correction computer shown in FIG. 4.

FIG. 10 is a simplified block diagram of the color correction computer which is divided into an analyzer system 134 and a correctability decision system 136. The analyzer system 134 has as its inputs a set of signals representing the uncorrected color components $R_U$, $G_U$ and $B_U$ of the video camera output as generated by the test color separator (FIG. 6) and a set of signals representing the corresponding reference color components, $R_T$, $G_T$ and $B_T$ as provided by the reference color generator (FIG. 7). These two sets of signals comprise the touchstone set described hereinabove with reference to FIG. 1. The pulse output from the time gate generator (FIG. 5) indicating an end of a set of test colors and initiating the correction process is also coupled to the analyzer system 134. The analyzer system 134 operates on the touchstone set information to generate the nine gain values for the color corrector. It also calculates and stores a set of correction indices, $I_1, I_2 \ldots I_m$, which correspond to figures of merit for color reproduction quality and also comprise the ordering limits discussed above in connection with FIG. 3. The analyzer system 134 also provides a logic signal indicating completion of the analysis process.

The correctability decision system essentially compares each of the correction indices with preselected limits. If any index exceeds its corresponding limit the probability is that the gain values calculated by the analyzer system 134 will not improve the color quality. A 0 logic level is produced at output 78 indicating that color correction is to be bypassed. If all indices are below their preselected limits a logic level 1 is produced and the calculated correction is applied to the video signal.

Figure 11:
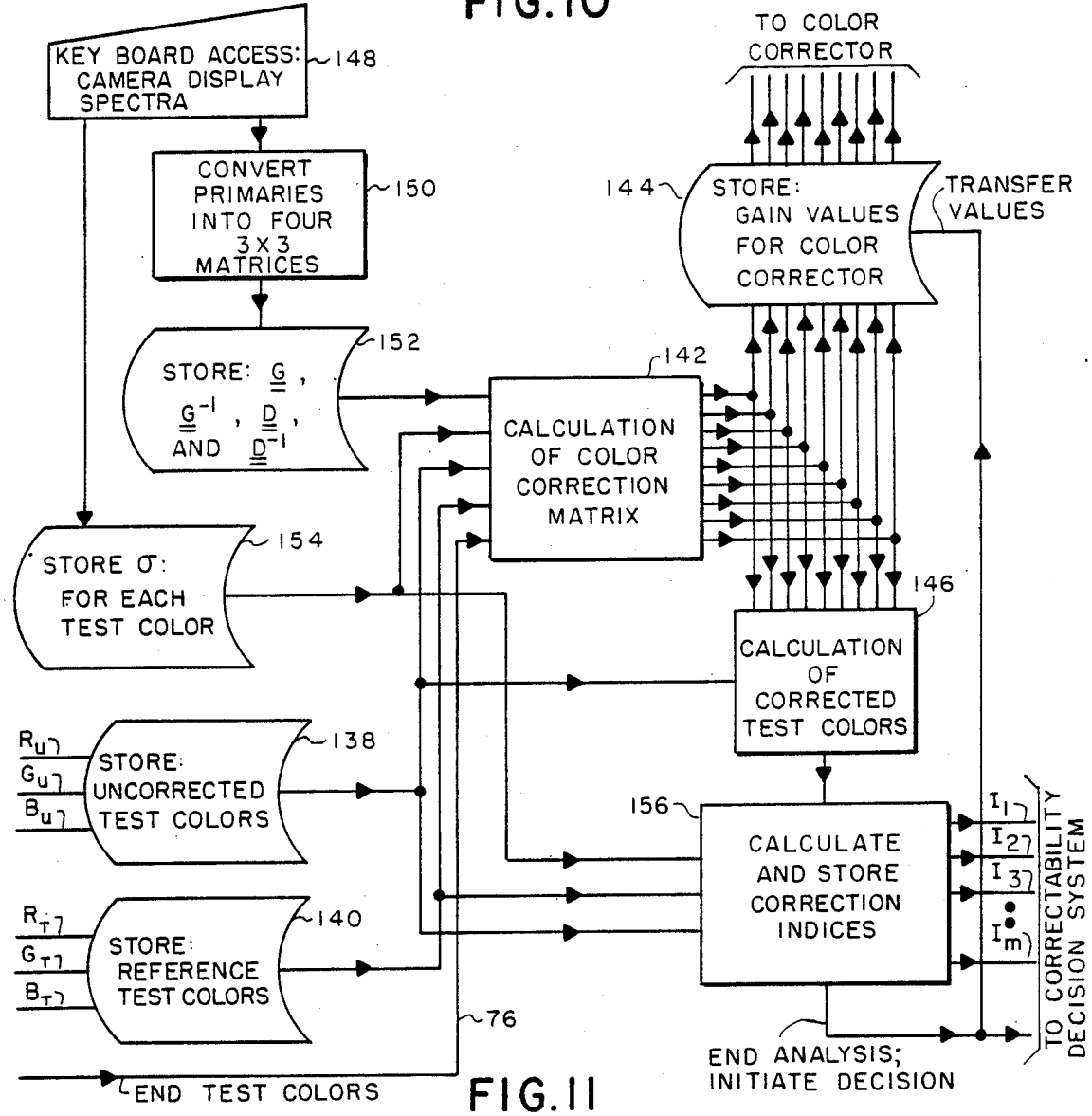
FIG. 11 is a flow chart illustrating the operation of the analyzer system shown in FIG. 10.

The operation of the analyzer systems 134 of FIG. 10 is illustrated in flow chart form in FIG. 11. The uncorrected outputs $R_U$, $G_U$, $B_U$, of the test color generator (FIG. 6) are stored in memory 138 and the corresponding outputs, $R_T$, $G_T$, $B_T$, from the reference color generator (FIG. 7) are stored in memory 140. When activated by the logic signal from the output 76 of the time gate generator (FIG. 5) the analyzer system at 142 calculates the gain values for the color corrector and the same are stored in memory 144 as well as used at 146 to calculate the corrected test colors.

The remaining parameters necessary to the process include the camera primary spectra, $r(\lambda)$, $g(\lambda)$ and $b(\lambda)$ and the display output primary spectra $r_d(\lambda)$, $g_d(\lambda)$ and $b_d(\lambda)$ and are entered via keyboard access 148. Generally the spectral values are entered for wavelengths in the visible range at intervals of about 10 nanometers. The spectral data is converted at step 150 into four 3×3 matrices which are stored in memory 152. More specifically these matrices, $\underline{\underline{G}}$, its inverse, $\underline{\underline{G}}^{-1}$, $\underline{\underline{D}}$ and its inverse, $\underline{\underline{D}}^{-1}$, are the parameters that represent the camera and display spectra respectively as used in the correction calculation in all respects of significance to the correction process.

The remaining set of parameters required by the analyzer system is the set of priority weights $\sigma_i$, one value of $\sigma$ for each test color, i. The optional set of values of $\sigma_i$ depends in large part on subjective factors, including the "importance" of the corresponding color and generally cannot be specified in advance. One set of values, once accepted, would probably work well for any system of a given class; e.g. video systems for outdoor scenes. An optimal set of values will cause the correctability decision criteria all to be satisfied a maximum percentage of the time for a given set of primaries and given classes of scene material. The output of the analyzer system is not, as a practical matter, highly sensitive to the selection of $\sigma_i$ values and an arbitrary initial selection (e.g. all $\sigma_i=1$) is sufficient. Evolutionary improvements in the selection may be made as it is found that a higher value for any given test color produces satisfactory corrections in a greater number of cases. The set of $\sigma_i$ values are stored at memory 154.

Upon application of the initiating signal at 76 the calculation at 142 may proceed, the essential result of which is the calculation of the color correction matrix, $\underline{\underline{M}}$, and the closely related set of gain values, $\underline{\underline{N}}$, where:

$$\underline{\underline{N}} = \begin{pmatrix} RR & GR & BR \\ RG & GG & BG \\ RB & GB & BB \end{pmatrix}$$

required by the color corrector and stored in memory 144. These output values are used at 156 to simulate the color corrector as well as the corrected output as applied to the set of test colors. In terms of system signal values or components, the corrected colors are based upon the uncorrected color components and given in the simplest version by the matrix multiplication $$\begin{pmatrix} R_C \\ G_C \\ B_C \end{pmatrix} = \underline{\underline{N}} \begin{pmatrix} R_U \\ G_U \\ B_U \end{pmatrix} \tag{4}$$

At step 156 the inputs are thus the uncorrected test colors from memory 138, the corrected test colors from step 146, the reference test colors from memory 140, the values of $\sigma_i$ from memory 154 and the color correction matrix $\underline{\underline{M}}$ or $\underline{\underline{N}}$ from block 146. The function at block 156 is to make all comparisons between corrected, uncorrected, and reference colors that characterize the quality of performance of the system on any given frame to be corrected.

Several figures of merit or correction indices may be selected to characterize performance quality. Each figure of merit may be selected to have an ideal value of zero with worse conditions always being positive and an upper limit value representing unsatisfactory quality for the color reproduction aspects subject to that index. In the preferred embodiment several indices are used and if any one should exceed its upper limit value the result of the correction process is deemed inferior to the uncorrected video signal and correction is bypassed as described above. The primary index $I_1$, is given by $$I_1 = \sum_{i=1}^{3} \sum_{k=1}^{N} \sigma_k (U_{ik} - \sum_{j=1}^{3} M_{ij} V_{jk})^2 \tag{5}$$

$$= (\underline{U} - \underline{\underline{M}} \, \underline{V})^T \sigma (\underline{U} - \underline{\underline{M}} \, \underline{V})$$

which is the weighted sum of the squares of the deviations of all corrected color components, $(MV)_j$, from their corresponding reference color components, $U_j$, with all components being taken in terms of orthogonal color space. Thus, $I_1=0$ only if all corrected colors match their respective reference colors. Any deviation results in a positive value for $I_1$.

$I_2$ is a secondary index complementary to $I_1$ and is represented for example, by:

$$I_2 = Max\{[(u_{Ci}-u_{Ti})^2+(v_{Ci}-v_{Ti})^2-(u_{Ui}-u_{Ti})^2- \\ (v_{Ui}-v_{Ti})^2], 0\} \tag{6}$$

i.e. the larger of zero or the bracketed quantity for any touchstone color, i, where:

$$u_i = \frac{4X_i''}{X_i'' + 15Y_i'' + 3Z_i''} \tag{7}$$

and $$v_i = \frac{6Y_i''}{X_i'' + 15Y_i'' + 3Z_i''} \tag{8}$$

where (7) and (8) are applied separately to $u_{Ci}$, $v_{Ci}$, the corrected touchstone colors, to $u_{Ti}$, $v_{Ti}$, the target colors and to $u_{Ui}$, $v_{Ui}$ the uncorrected colors, and where $X_i''$, $Y_i''$ and $Z_i''$ are the calculated C.I.E. color components as they appear at the display output of test color, i, in ordinary color space, and $u_i$ $v_i$ are the corresponding chromaticities in the 1960 C.I.E.-U.C.S. color space as defined by D. Judd and G. Wyszecki in "Color in Business, Science and Industry," third edition, Wiley, 1975. The significance of $I_\alpha$ is that it is positive when any corrected test color component deviates from its reference color more than the corresponding uncorrected test color. Thus, an $I_\alpha$ value greater than zero represents degradation of at least one color by the correction process.

A third or severity index, $I_3$, is defined as:

$$I_3 = Trace \\ [(M-1)^2] = (M_{11}-1)^2+(M_{22}-1)^2+(M_{33}-1)^2+2M_{12}^2 \\ +2M_{23}^2+2M_{31}^2 \tag{9}$$

Effectively when $I_3=0$ the correction is nil and increasing values represent increasing severity of the correction. In theory $I_3$ could be large (e.g. 0.5) when $I_1$ and $I_2$ would not exceed their established upper limit values. Such a condition would indicate an unreliability of the computer correction. On the premise that no correction is preferred to one that is unreliable the correction would be bypassed.

Once the step at 156 is complete a signal representing end of analysis and initiating the correctability decision system is transmitted at 158 and also operates to enable transfer of the new gain values to memory 144.

Figure 12:
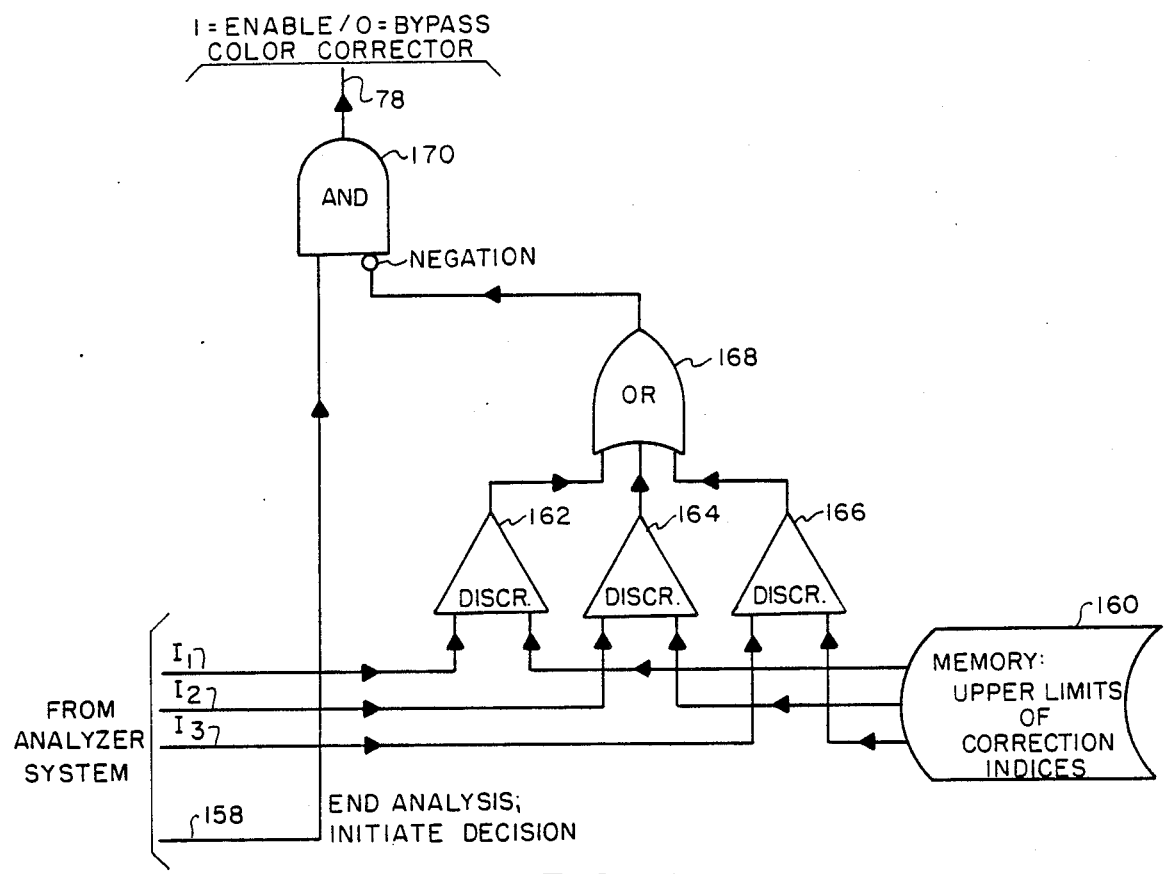
FIG. 12 is a circuit diagram of the correctability decision system shown in FIG. 10.

FIG. 12 represents the correctability decision system of the color correction computer to which the outputs of the analyzer system are coupled. The preselected upper limits for each index $I_1$, $I_2$, $I_3$, are stored at 160. Discriminators 162, 164 and 166 compare each index value with its corresponding limit and output a logic level 1 if the threshold is exceeded. The discriminator outputs are coupled to OR circuit 168 which has as its output a logic level 1 if any of the indices exceeds its upper limit. The OR circuit output is coupled to and acts as a negation input to AND gate 170. A logic level 1 at the output 78 of AND gate 170 enables the corrected color gate 102 (FIG. 8) and inhibits the bypass gate (104) thus enabling correction of the video signal by the color matrix. If any index upper limit is exceeded the AND gate output is a logic level 0 which causes the color corrector to bypass correction.

Figure 13:
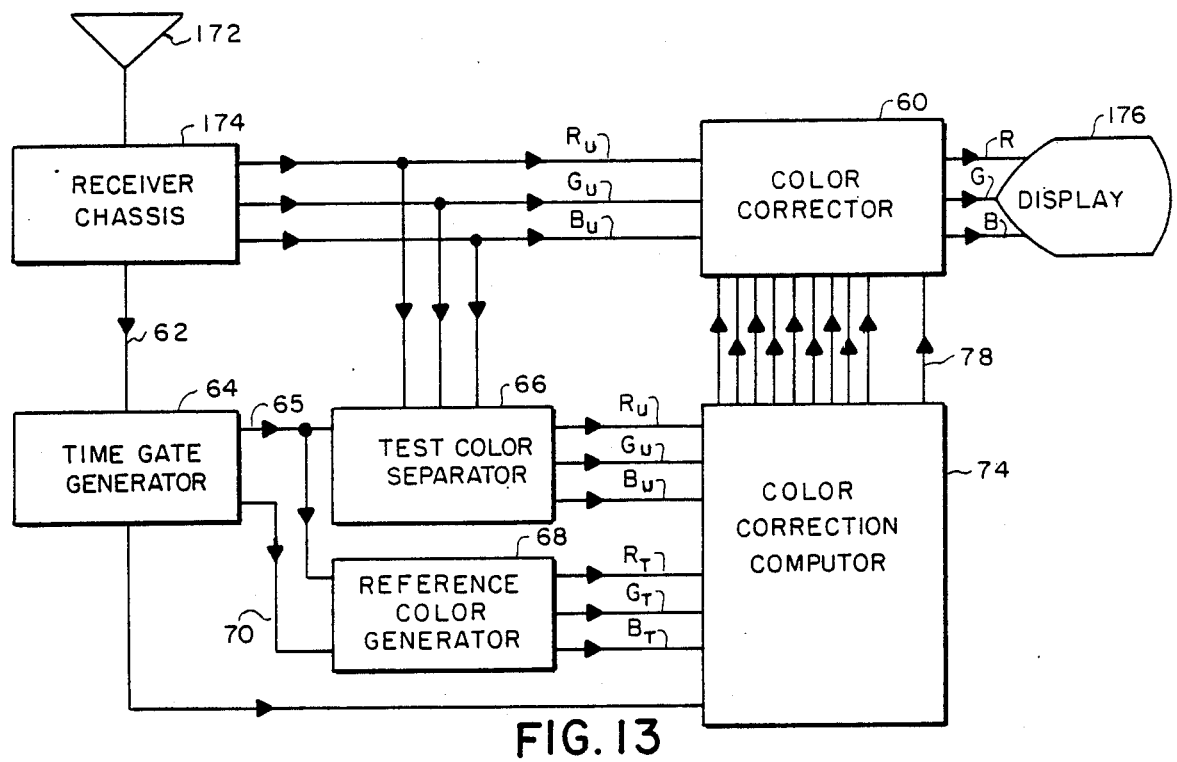
FIG. 13 is a block diagram of a video receiver system incorporating color correction apparatus in accordance with the present invention.

FIG. 13 represents a video receiver system incorporating color correction apparatus in accordance with the present invention. An antenna 172 receives broadcast signals which are applied to the receiver chassis 174. The video output of the receiver chassis 174 is equivalent to that of the video camera 58 of FIG. 4 except that it is affected by further distortions in the broadcast, propagation and detection processes. The same color correction method and apparatus as discussed with respect to FIG. 4 are applicable to the receiver system of FIG. 13 and common elements are identified by like reference characters. The output of the color corrector 60 is, in this embodiment, applied to a display 176.

Figure 14:
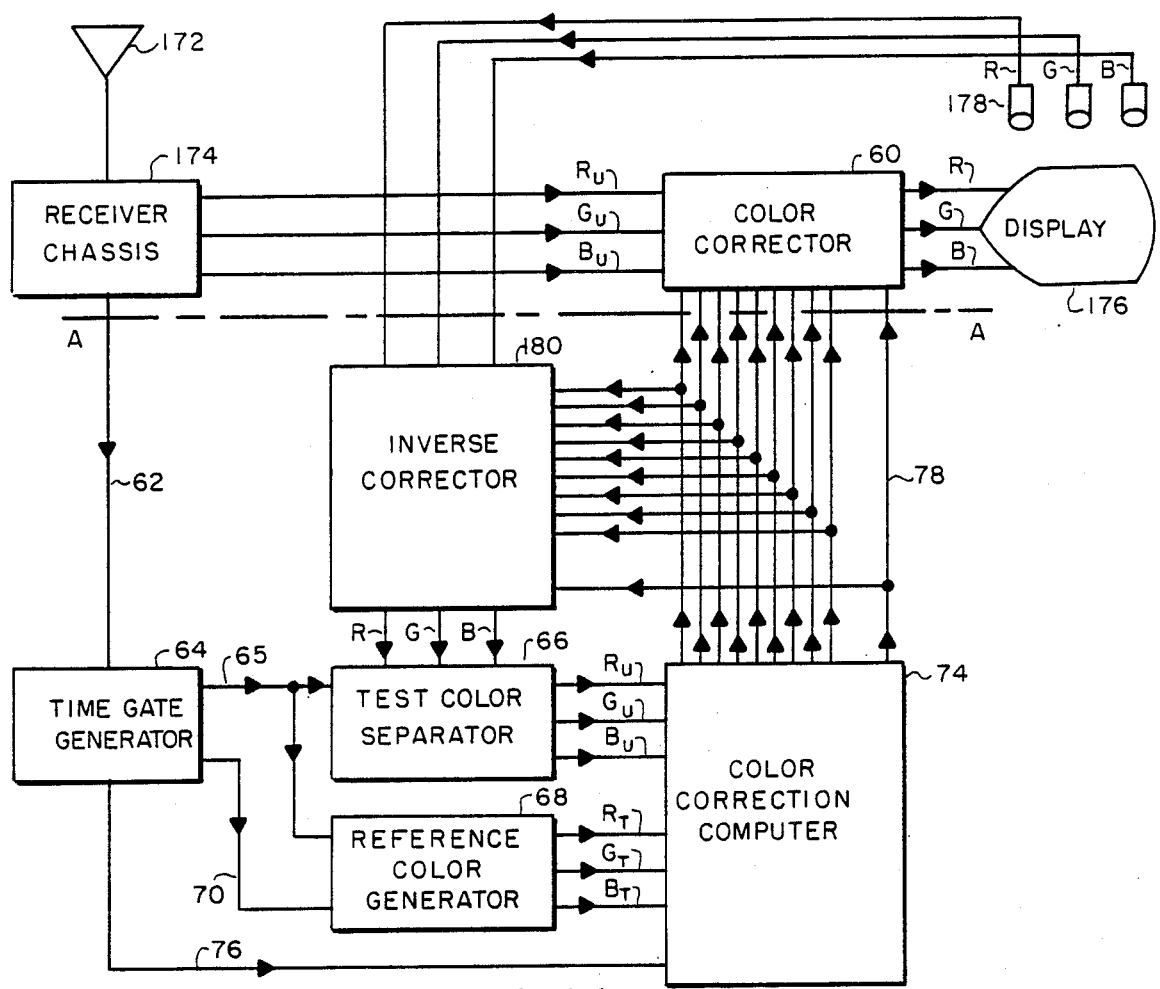
FIG. 14 is a block diagram of a video receiver incorporating color corrective feedback to compensate for display phosphor characteristics in accordance with the present invention.

FIG. 14 illustrates another video receiver wherein elements common to those shown in FIG. 13 are identified by like reference characters. This system incorporates a provision for color corrective feedback to compensate for changes in the electronic and phosphor color characteristics of the display 176 and is therefore an illustration of the feedback system of FIG. 2B. A set of photocells $178_{R,G,B}$ are disposed at an inconspicuous corner of the display 176 each viewing its respective primary test color. Each test color may be displayed at the same location but at different times during a given frame presentation.

The color information input to the test color separator 66, rather than being the video output from receiver chassis 174, is the output of the photocells 178 applied via an inverse corrector 180 which compensates for the fact that the feedback signal is being taken from a point past which the video signal has been corrected. As discussed above, the color corrector 60 includes a correction matrix, $\underline{N}$, to correct the video signal. The inverse corrector 180 uses the inverse, $\underline{N}^{-1}$, of the correction matrix. Additionally a fixed matrix multiplication by $\underline{D}^{-1}$ compensates for the fact that there is a conversion from video signal space to display image viewing space cascaded into the feedback loop. This multiplication ensures that the color information input to the test color separator 66 is as similar as possible to the video signals used in the previously discussed embodiments.

The embodiment of FIG. 14 is particularly useful in the manufacture and repair of video receivers as a calibration tool. The photocells 178 together with all components below the chain line A—A may be removable test equipment and the color corrector 60 need only be provided with fixed gains between calibrations. With the color controls set at predetermined standard settings the video receiver may be adjusted to a uniform standard of color performance.

Figure 15:
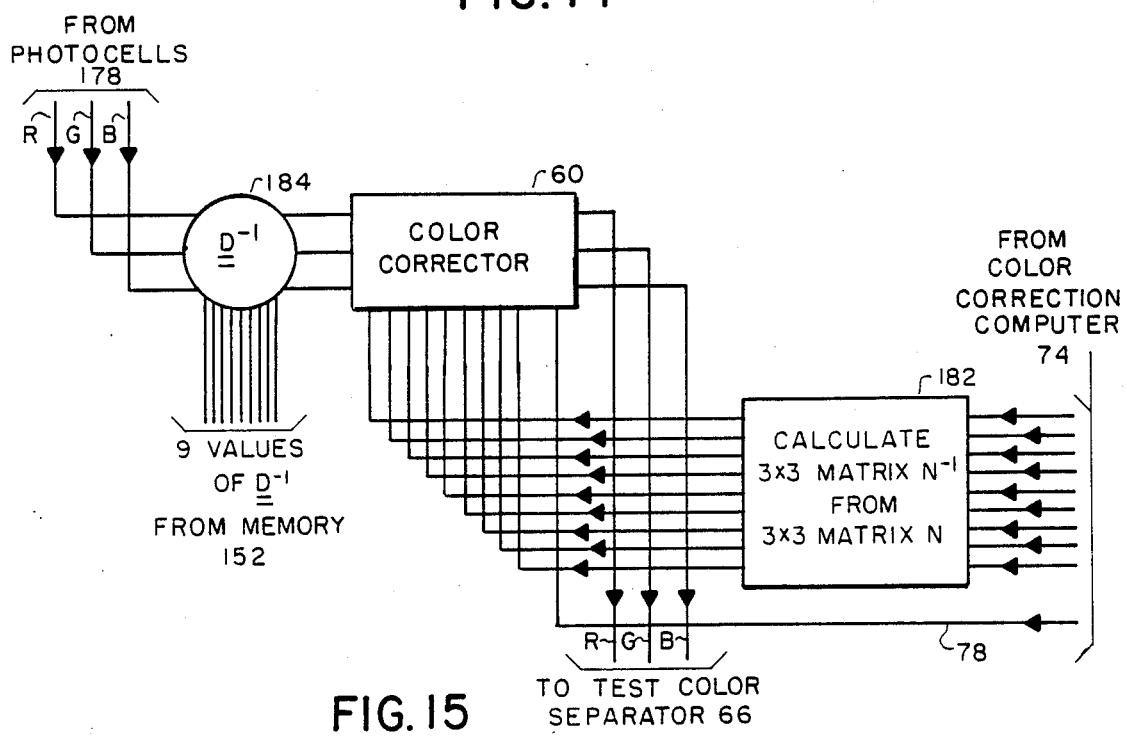
FIG. 15 is a block diagram of an inverse corrector useful in the apparatus of FIG. 14.

FIG. 15 is a more detailed view of the inverse corrector 180 of FIG. 14. The inverse corrector functions in the same manner as the color corrector 60 except that it is used to prevent cascading of color corrections within a single feedback loop. A matrix converter 182 has as its input the matrix of correction gains, $\underline{N}$, as produced by the color correction computer 74. This matrix is converted to its inverse, $\underline{N}^{-1}$, which is coupled to the color corrector 60. A second color matrix 184 receives the output signals from the photocells 178 of FIG. 14 and also the nine values from the matrix, $\underline{D}^{-1}$, representing the inverse of the display output primary spectra. Thus allowance is made for the fact that the photocell outputs represent the phosphor display rather than original scene colors.

Figure 16:
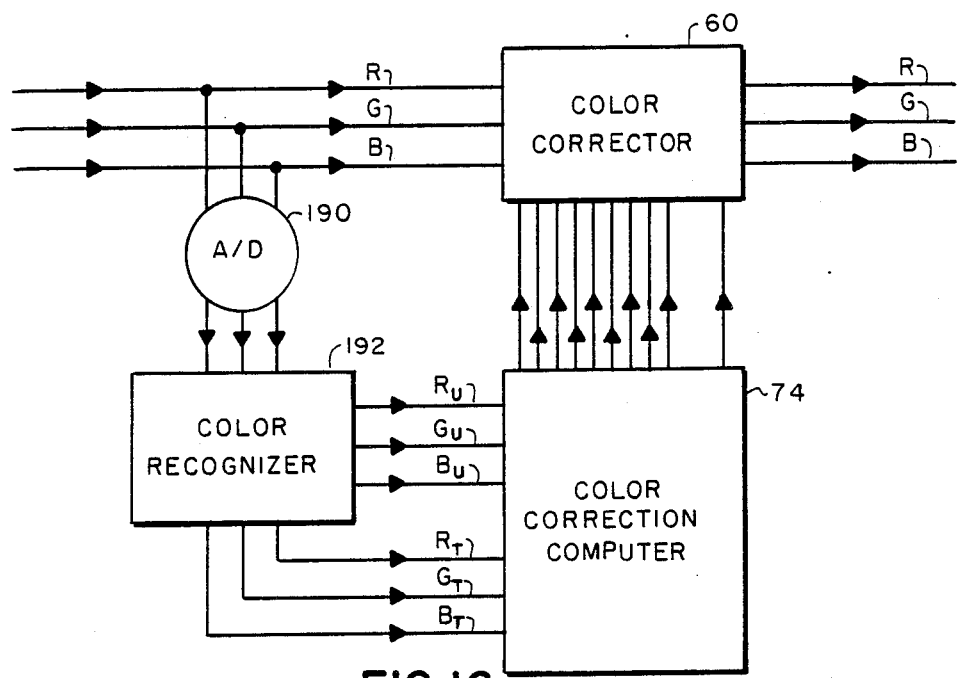
FIG. 16 is a block diagram of a color correction system for use where reference colors are not available in the scene being reproduced.

FIG. 16 is a further embodiment of a color correction system wherein it is not required that the scene be provided with test colors. This embodiment is based upon the premise that there is a significant chance that the scene as viewed by a video camera or as transmitted by a broadcast system contains some colors that resemble colors of the test set in chromaticity under standard illumination, as well as under chromaticity shifts due to camera system distortion plus illumination color temperature shifts.

Figure 17:
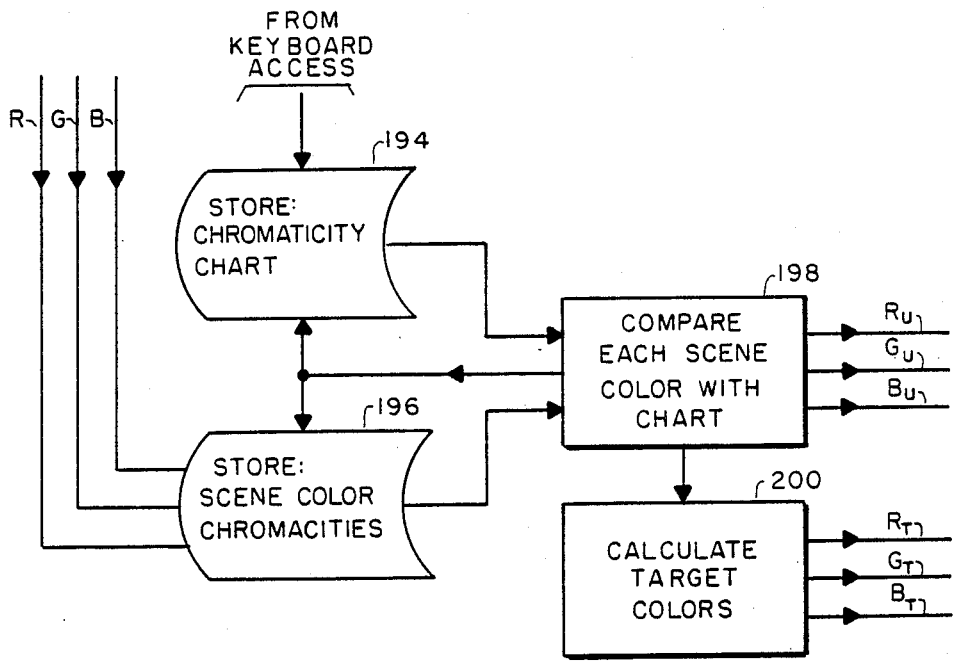
FIG. 17 is a diagram representing the operation of the color recognizer of FIG. 16.

An analog to digital converter 190 samples the video output signal. The outputs of the converter are the digitized values of the primary color components which are coupled to a color recognizer 192 the operation of which is shown in the diagram of FIG. 17. The outputs of the color recognizer 192 are the set of touchstones which are applied to and operated upon by the correction computer 74 to generate the correction and correctability inputs to the color corrector 60. The color recognizer registers all scene chromaticities and relates selected scene colors to their corresponding reference thus establishing a touchstone set for each of the selected scene colors.

Given the reflection spectrum of any object, one can calculate the corresponding spectrum seen by an observer by simply multiplying it by the spectrum of the source of illumination. Source spectra are readily calculated to good approximation for any color temperature as the well known Planck Radiation Spectrum for that temperature. Likewise, given a set of video camera receptor spectra, as empirical data, the "track" made by any object spectrum on a chromaticity chart may be straightforwardly calculated as a function of illumination color temperature. Such tracks are quite simple curves, generally exhibiting minor curvature over substantial ranges of realistic color temperatures; e.g. 3,000°–20,000° K., and are stored in memory 194. Scene color chromaticities are registered and stored in memory 196.

By selecting a reasonable number of test colors whose spectra are well known, such as the color patches on the MacBeth Color Checker test chart, and plotting the tracks for each of these colors on a chromaticity chart over the range of color temperatures a series of curves are derived, which are generally non-intersecting.

Scene colors are identified in relation to known variations in chromaticity with illumination color temperature of a standard test color set (rather than of actual scene colors). For each scene color identified as closely approximating a color of the standard set at some particular color temperature at 198 a set of uncorrected values is determined. A corresponding target touchstone is generated based upon the calculation at 200 of the chromaticity of the identified color at preselected standard illumination conditions; e.g. 6500° K. If multiple colors are so identified, but with contradictions, such as inconsistent color temperatures, then an appropriate correction index is provided in the correction computer to bypass a questionable correction. The priority weight values, $\sigma_i$, are set to zero for all stored reference colors, i, which are not identified in the scene by the color recognizer. Thus, the number of touchstone pairs may vary with the scene content.

As an alternative to tracking all scene colors, the color recognizer 192 may only identify a single color, such as white, under a momentary test condition. Again, given the video camera receptor spectra as empirical data and a single test object of known spectrum, the illumination color temperature is determined by where on the chromaticity chart the trajectory of the scene color matches the test color on its color temperature scale. With the color temperature so determined, a touchstone target color corresponding to each scene color is determined by calculating a trajectory through this chromaticity parallel to that of the nearest test color and of a length necessary to reach the standard 6500° K. illumination temperature. A set of touchstones are calculated from the stored reference color information for selected colors in the test set at the determined value of illumination color temperature (uncorrected values) and at standard illumination conditions (target values). The algorithm to find illumination temperature from even a single test color is redundant. If the two potential determinations from the R,G,B components are inconsistent, then an appropriate correction index is provided to bypass this correction.

In yet a further embodiment the color recognizer may employ what the applicants have denominated the Gamut Expansion method. The target colors are derived from the most extreme values of scene chromaticity and the most central. The method approximates the human perception of an object color as constant under a variety of illumination conditions. The color recognizer registers all scene chromaticities, for example in terms of the 1960 CIE-UCS coordinates, u and v. Using the chromaticity chart the four gamut extremes of the scene colors may be identified; i.e. where u is maximum and minimum and where v is maximum and minimum. A fifth characteristic scene color is the center of the four distinctive gamut extremes on the chromaticity chart. The reference color generator provides a target color for each of the five characteristic scene colors. Target touchstones are derived from the selected limits of scene chromaticities that reset these extremes and the central scene chromaticities to new values. These new values are based upon the initial set as well as values based upon the most extreme scene chromaticity limits in the same direction from the chromaticity chart center and on the chromaticity of the selected standard illumination source. Conditions under which scene chromaticities do not occupy a sufficient area on the chromaticity chart relative to the area occupied by average scenes provide the basis of a correctability index to bypass questionable corrections.

As indicated above the principles of the applicants' invention are applicable to reproducing systems generally. Even many systems which may appear to be single channel may be broken down into an arbitrary number of channels. For example, in an audio system a series of filters, each passing a portion of the frequency band being reproduced, may provide the touchstone set of original-dependent inputs to the correction computer. In a photographic system it is possible to expose an edge of the color film outside the actual picture frame through suitable filters to provide the test colors. After the film is developed and placed in a color printer, photocells may be used to derive the touchstone set input to the correction computer. The computer output is then used to automatically adjust the color content of the printer exposure light.

From the foregoing it will be understood that the applicants have provided a new and novel method and apparatus for correcting distortions in reproducing systems whereby the objectives set forth hereinabove are efficiently met. Since certain changes in the above-described construction and process will occur to those skilled in the art without departure from the scope of the invention it is intended that all matter set forth hereinabove or shown in the various views of the appended drawings shall be interpreted as illustrative and not in a limiting sense.

Having described what is new and novel and desired to be secured by Letters Patent, what is claimed is:

1. A method of correcting distortions of an original phenomenon introduced by a system for reproducing said phenomenon, said method comprising the steps of:
   A. defining a plurality of subcategories of the information content of said phenomenon;
   B. defining a first set of values representing an ideal representation of said phenomenon in each of said subcategories;
   C. defining a second set of values corresponding to said first set, and representing said phenomenon as reproduced by said reproducing system in each of said subcategories;
   D. comparing said first and second sets of said values to thereby define a distortion function;
   E. if said distortion function does not indicate the absence of distortion, calculating a correction to be applied to said phenomenon as reproduced as a whole, said correction being a third set of said values representing an approximation of the effective inverse of said distortion function; and
   F. applying said correction to said phenomenon as reproduced as a whole whereby said phenomenon as reproduced and corrected as a whole represents the substantial equivalent of said original phenomenon as a whole.

2. The method defined in claim 1 further including the steps of
   successively repeating steps C, D and E;
   comparing each successive correction with the last applied correction;
   if a later correction is less than the last applied correction applying said later correction to said phenomenon as reproduced; and
   if said later correction is greater than the last applied correction continuing to apply the last applied correction to said phenomenon as reproduced.

3. The method defined in claim 2 further including the step of
   ceasing to successively repeat steps C, D and E when said later correction is greater than the last applied correction.

4. The method defined in claim 1 further including the steps of
   defining a plurality of criteria representing acceptable limits of said correction;

evaluating said calculated correction against said criteria; and if said calculated correction is within said limits, applying said correction to said phenomenon as reproduced, and, if said calculated correction is not within said limits, bypassing said correction.

5. The method recited in claim 1 wherein each of said subcategories of information content is interrelated to each of the other said subcategories; and said correction calculating step includes the steps calculating a correction approximating the effective inverse of the distortion function for each corresponding value of said first and second sets of said values, and calculating a correction approximating the effective inverse of the distortion function for each value of said first set of values as a result of distortion introduced in each other value of said first set of values.

6. Apparatus for correcting distortions of an original phenomenon introduced by a system for reproducing said phenomenon, said apparatus comprising means for sampling a preselected plurality of subcategories of the information content of the output of said reproducing system and generating a first set of signals representing each of said subcategories;

means for generating a second set of signals representing said preselected plurality of subcategories of the information content of said original phenomenon corresponding to said first set of signals;

means for analyzing said first set of signals with respect to said second set of signals to thereby define the distortion introduced by said reproducing system and for generating a third set of signals representing a correction approximating the effective inverse of said distortion to be applied to the output of said reproducing system; and means for applying said third set of signals to the output of said reproducing system to thereby correct said output such that said phenomenon as reproduced and corrected as a whole represents the substantial equivalent of said original phenomenon as a whole.

7. Apparatus as recited in claim 6 further including means for generating a plurality of criteria signals representing preselected acceptable limits of said third set of signals;

means for comparing said third set of signals with said criteria signals and generating a first output signal when said third set of signals are within said limits and a second output signal when said third set of signals are not within said limits.

means coupled to said comparing means for bypassing said correction applying means such that correction of the output of said reproducing system may be selectively bypassed in response to said second output signal and applied in response to said first output signal.

8. Apparatus as recited in claim 6 wherein said analyzing means comprises means for analyzing each signal of said first set of signals with respect to each corresponding signal of said second set of signals to determine the intra-dependent distortions introduced by said reproducing system and generating a first set of correction signals representing the effective inverse of said intra-dependent distortions; and means for analyzing each signal of said first set of signals with respect to each other signal of said second set of signals to determine the inter-dependent distortions introduced by said reproducing system, and generating a second set of correction signals representing the effective inverse of said inter-dependent distortions.

9. Apparatus for correcting distortions in the color of an original scene introduced by a system for reproducing said scene, said apparatus comprising means for sampling a preselected plurality of colors contained in said original scene and generating a first set of signals representing each of said sampled colors;

means for sampling the output of said reproducing system of each of said preselected plurality of colors and generating a second set of signals representing each of said sampled colors as reproduced;

means for analyzing said second set of signals with respect to said first set of signals to thereby define the distortion introduced by said reproducing system and for generating a third set of signals representing a correction approximating the effective inverse of said distortion to be applied to the output of said reproducing system; and means coupled to said analyzing means for applying said third set of signals to the output of said reproducing system to thereby correct said output such that the color of said scene as reproduced and corrected as a whole represents the substantial equivalent of the color of said original scene as a whole.

10. Apparatus as recited in claim 9 wherein said analyzing means comprises means for analyzing each signal of said second set of signals with respect to each corresponding signal of said first set of signals to determine the intra-dependent distortions introduced by said reproducing system, and generating a first set of correction signals representing the effective inverse of said intra-dependent distortions; and means for analyzing each signal of said second set of signals with respect to each other signal of said first set of signals to determine the inter-dependent distortions introduced by said reproducing system, and generating a second set of correction signals representing the effective inverse of said inter-dependent distortions.

11. Apparatus as recited in claim 9 further including means for storing at least one correction index representing a preselected limit for the correction to be applied to the output of said reproducing system;

means for analyzing said third set of signals with respect to said stored correction index and for generating a correction control signal of a first level when said correction is within said preselected limit and of a second level when said correction is beyond said preselected limit; and said correction applying means includes means responsive to said correction control signal to apply said correction to the output of said reproducing system in response to said first level and to bypass application of said correction in response to said second level.

12. Apparatus as recited in claim 9 wherein said correction applying means comprises at least one variable gain amplifier having an input adapted to receive each signal of said second set of signals and a control input coupled to said analyzing means and adapted to receive each of said third set of signals whereby the gain of each said amplifier is adjusted such that the output thereof is substantially the equivalent of each corresponding signal of said first set of signals.

13. Apparatus as recited in claim 10 wherein said correction applying means comprises a matrix of at least $N^2$ variable gain amplifiers wherein N represents the number of signals of said second set of signals, each said amplifier having an input, a control input and an output;

each signal of said second set of signals being coupled to a respective input of said N amplifiers;

each of said first set of correction signals being coupled to the respective control inputs of the amplifiers having as its input the corresponding signal of said second set of signals whereby the gain of each said amplifier is adjusted such that the output thereof is substantially the equivalent of each corresponding signal of said first set of signals and intra-dependent distortion is substantially corrected;

each of said second set of correction signals being coupled to the respective control input of the amplifiers having as inputs the other signals of said second set of signals whereby the gain of each said amplifier is adjusted to substantially correct interdependent distortion at the output thereof;

summation means coupled to the outputs of all said amplifiers having outputs related to each signal of said second set of signals to thereby provide substantial correction of said second set of signals for both intradependent and interdependent distortion.

14. Apparatus as recited in claim 9 wherein said system for reproducing said scene is a color video camera;

said preselected plurality of colors are the primary red, green and blue video color channel outputs of said camera;

said means for sampling the outputs of said camera comprises means coupled to said camera for separating the signals representing said primary colors from said scene as reproduced, and converting said signals to digital form; and said means for sampling said primary colors in said original scene comprises means for storing representations of said colors and means for selectively accessing said storing means.

15. Apparatus as recited in claim 9 wherein said system for reproducing said scene is a color video receiver;

said preselected plurality of colors are the primary red, green and blue video color channel outputs of said receiver;

said means for sampling the outputs of said receiver comprises means coupled to said receiver for separating the signals representing said primary colors from said scene as reproduced, and converting said signals to digital form and said means for sampling said primary colors in said original scene comprises means for storing representations of said colors and means for selectively accessing said storing means.

16. Apparatus as recited in claim 15 wherein said color video receiver includes a video display;

said means for sampling the outputs of said receiver include a photocell sensitive in each of the primary red, green and blue colors associated with said video display, an inverse corrector coupled to the outputs of said photocells and adapted to receive and invert said third set of signals from said analyzing means and apply said inverted signals to the outputs of said photocells to provide said second set of signals, means coupled to the output of said inverse corrector for separating the signals representing said primary colors from said scene as reproduced and means for converting said signals to digital form.

* * * * *